US012460300B2

(12) United States Patent
Rendall et al.

(10) Patent No.: US 12,460,300 B2
(45) Date of Patent: Nov. 4, 2025

(54) METHOD AND APPARATUS FOR SPUTTER DEPOSITION OF TARGET MATERIAL TO A SUBSTRATE

(71) Applicant: Dyson Technology Limited, Wiltshire (GB)

(72) Inventors: Michael Edward Rendall, Newbury (GB); Robert Ian Joseph Gruar, Swindon (GB)

(73) Assignee: Dyson Technology Limited, Wiltshire (GB)

( * ) Notice: Subject to any disclaimer, the term of this patent is extended or adjusted under 35 U.S.C. 154(b) by 642 days.

(21) Appl. No.: 17/776,590

(22) PCT Filed: Nov. 10, 2020

(86) PCT No.: PCT/GB2020/052839
§ 371 (c)(1),
(2) Date: May 12, 2022

(87) PCT Pub. No.: WO2021/094722
PCT Pub. Date: May 20, 2021

(65) Prior Publication Data
US 2022/0389586 A1 Dec. 8, 2022

(30) Foreign Application Priority Data
Nov. 15, 2019 (GB) ..................................... 1916622

(51) Int. Cl.
*C23C 14/56* (2006.01)
*C23C 16/455* (2006.01)
(Continued)

(52) U.S. Cl.
CPC .............. *C23C 16/52* (2013.01); *C23C 14/56* (2013.01); *C23C 16/45536* (2013.01); *H01J 37/3277* (2013.01)

(58) Field of Classification Search
None
See application file for complete search history.

(56) References Cited

U.S. PATENT DOCUMENTS 3,829,373 A * 8/1974 Kuehnle ............. H01J 37/3402 204/192.12
4,026,787 A 5/1977 Kuehnle
(Continued)

FOREIGN PATENT DOCUMENTS

CN 101457343 A 6/2009
CN 101527362 A 9/2009
(Continued)

OTHER PUBLICATIONS

Kikuchi et al., "Modification of Film Structure in Sputtering Process," Journal of the Vacuum Society of Japan, vol. 50, No. 1, 2007, pp. 14-21.
(Continued)

*Primary Examiner* — Jason Berman
(74) *Attorney, Agent, or Firm* — Tucker Ellis LLP

(57) ABSTRACT

Apparatus for sputter deposition of target material to a substrate is disclosed. In one form, the apparatus includes a substrate guide arranged to guide a substrate along a curved path and a target portion spaced from the substrate guide and arranged to support target material. The target portion and the substrate guide define between them a deposition zone. The apparatus includes a confining arrangement including one or more magnetic elements arranged to provide a confining magnetic field to confine plasma in the deposition zone thereby to provide for sputter deposition of target material to the web of substrate in use. The confining magnetic field includes magnetic field lines arranged to, at
(Continued)

least in the deposition zone, substantially follow a curve of the curved path so as to confine said plasma around said curve of the curved path.

18 Claims, 5 Drawing Sheets

(51) Int. Cl.
*C23C 16/52* (2006.01)
*H01J 37/32* (2006.01)

(56) References Cited

U.S. PATENT DOCUMENTS 4,278,528 A 7/1981 Kuehnle et al.
4,492,620 A 1/1985 Matsuo et al.
4,515,107 A * 5/1985 Fournier ............... C23C 16/511 136/258
4,849,087 A 7/1989 Meyer
4,990,229 A 2/1991 Campbell et al.
5,091,049 A 2/1992 Campbell et al.
5,122,251 A 6/1992 Campbell et al.
5,215,638 A 6/1993 Hausler
6,066,826 A * 5/2000 Yializis ............. H01J 37/32596 219/121.52
6,103,070 A 8/2000 Hong
6,632,563 B1 10/2003 Krasnov et al.
2001/0033952 A1 10/2001 Jenson et al.
2002/0144656 A1 10/2002 Yoshikawa et al.
2002/0175069 A1 11/2002 Domoto et al.
2004/0048157 A1 3/2004 Neudecker et al.
2004/0089535 A1 5/2004 Wolfe et al.
2004/0118678 A1 6/2004 Hartig
2006/0134522 A1 6/2006 Zhang et al.
2006/0196766 A1 9/2006 Chen
2007/0125638 A1 6/2007 Zhang et al.
2007/0166612 A1 7/2007 Krasnov et al.
2007/0181421 A1 8/2007 Wei et al.
2007/0187229 A1* 8/2007 Aksenov ............. H01J 37/3266 204/298.41
2008/0023146 A1 1/2008 Shabalin
2008/0035471 A1 2/2008 Mikami et al.
2009/0032191 A1 2/2009 Chistyakov
2009/0057136 A1 3/2009 Wang et al.
2009/0159429 A1 6/2009 Tsukamoto
2009/0159433 A1 6/2009 Neudecker et al.
2009/0159441 A1 6/2009 Marunaka et al.
2009/0277778 A1 11/2009 Stowell et al.
2009/0288943 A1 11/2009 Kwak et al.
2011/0117433 A1 5/2011 Sabi et al.
2011/0226617 A1 9/2011 Hofmann et al.
2011/0266141 A1 11/2011 Drayton et al.
2012/0275008 A1 11/2012 Pradhan et al.
2013/0112546 A1 5/2013 Brown et al.
2014/0183036 A1 7/2014 Shao et al.
2015/0016265 A1 1/2015 Ahmadi
2016/0233541 A1 8/2016 Anapolsky et al.
2017/0207071 A1 7/2017 De Bosscher et al.
2018/0245217 A1 8/2018 Guo
2019/0153589 A1 5/2019 Puls et al.
2020/0095672 A1 3/2020 Honma et al.
2021/0371297 A1 12/2021 Perkins et al.
2022/0277940 A1 9/2022 Rendall
2022/0380885 A1 12/2022 Rendall et al.
2022/0380903 A1 12/2022 Rendall et al.
2022/0384159 A1 12/2022 Rendall et al.
2022/0393142 A1 12/2022 Gruar
2022/0396865 A1 12/2022 Rendall et al.
2022/0396869 A1 12/2022 Rendall
2022/0403499 A1 12/2022 Rendall et al.
2022/0407043 A1 12/2022 Rendall et al.
2022/0411913 A1 12/2022 Gruar
2023/0220539 A1 7/2023 Rendall et al.

FOREIGN PATENT DOCUMENTS

CN 101796213 A 8/2010
CN 101903560 A 12/2010
CN 101970709 A 2/2011
CN 102037586 A 4/2011
CN 105593395 A 5/2016
CN 105874641 A 8/2016
CN 105951053 A 9/2016
CN 205803586 U 12/2016
CN 106684325 A 5/2017
CN 108281618 A 7/2018
CN 109075006 A 12/2018
CN 109402562 A 3/2019
CN 109415802 A 3/2019
CN 109415804 A 3/2019
CN 109477203 A 3/2019
CN 109844900 A 6/2019
CN 110168130 A 8/2019
CN 110349838 A 10/2019
DE 4126236 A1 2/1993
DE 4418906 A1 12/1995
EP 0103461 A2 3/1984
EP 0403418 A2 12/1990
EP 0837490 A2 4/1998
EP 1729330 A1 12/2006
EP 2527487 A1 11/2012
EP 3396751 A1 10/2018
EP 3399539 A1 11/2018
GB 1462241 A 1/1977
GB 0007173 5/2000
GB 2360530 A 9/2001
GB 2572610 A 10/2019
JP 49-101273 A 9/1974
JP 61-009575 A 1/1986
JP 61-093542 A 5/1986
JP 03-068773 A 3/1991
JP H05-171433 A 7/1993
JP 10-150210 A 6/1998
JP H10-510676 A 10/1998
JP 11-269643 A 10/1999
JP 2002-235171 A 8/2002
JP 2003-007291 A 1/2003
JP 2004-043934 A 2/2004
JP 2006-257546 A 9/2006
JP 2006322055 A 11/2006
JP 2007-005219 A 1/2007
JP 2007-067183 A 3/2007
JP 2008-045213 A 2/2008
JP 2008-138229 A 6/2008
JP 2011-032550 A 2/2011
JP 2011-108532 A 6/2011
JP 2011-521433 A 7/2011
JP 2011-225932 A 11/2011
JP 2013-028824 A 2/2013
JP 2013-164971 A 8/2013
JP 2015193863 A 11/2015
JP 2015232158 A 12/2015
JP 2017066429 A 4/2017
JP 2017-186581 A 10/2017
JP 6215329 B2 10/2017
JP 2019-104956 A 6/2019
KR 10-2006-0124978 A 12/2006
KR 100762698 B1 10/2007
KR 10-2008-0000736 A 1/2008
KR 10-2011-0092965 A 8/2011
KR 10-2015-0005262 A 1/2015
KR 20180049257 A 5/2018
KR 101990881 B1 6/2019
KR 20190065233 A 6/2019
WO 89/07664 A1 8/1989
WO 02/21627 A2 3/2002
WO 2004/017356 A2 2/2004
WO 2009/143254 A2 11/2009
WO 2010/023878 A1 3/2010
WO 2010/144761 A2 12/2010
WO 2011/131921 A1 10/2011
WO 2014/156129 A1 10/2014
WO 2016/078693 A1 5/2016

(56) References Cited

FOREIGN PATENT DOCUMENTS

| | | | |
|---|---|---|---|
| WO | 2018/001523 | A1 | 1/2018 |
| WO | 2018/128009 | A1 | 7/2018 |
| WO | 2018/202656 | A1 | 11/2018 |
| WO | 2018/225822 | A1 | 12/2018 |
| WO | 2019/181095 | A1 | 9/2019 |
| WO | 2021/094721 | A1 | 5/2021 |
| WO | 2021/094772 | A1 | 5/2021 |

OTHER PUBLICATIONS

Office Action received for Japanese Patent Application No. 2022-528173, mailed on Aug. 1, 2023, 4 pages (2 pages of English Translation and 2 pages of Original Document).

Office Action received for Japanese Patent Application No. 2022-528178, mailed on Aug. 8, 2023, 6 pages (3 pages of English Translation and 3 pages of Original Document).

Office Action received for Japanese Patent Application No. 2022-528188, mailed on Aug. 8, 2023, 6 pages (3 pages of English Translation and 3 pages of Original Document).

Office Action received for Japanese Patent Application No. 2022-528189, mailed on Aug. 8, 2023, 6 pages (3 pages of English Translation and 3 pages of Original Document).

Office Action received for Japanese Patent Application No. 2022-528195, mailed on Oct. 17, 2023, 10 pages (6 pages of English Translation and 4 pages of Original Document).

International Search Report and Written Opinion received for PCT Patent Application No. PCT/GB2020/052838, mailed on Feb. 18, 2021, 9 pages.

International Search Report and Written Opinion received for PCT Patent Application No. PCT/GB2020/052893, mailed on Feb. 22, 2021, 11 pages.

International Search Report and Written Opinion received for PCT Patent Application No. PCT/GB2020/052896, mailed on Feb. 22, 2021, 10 pages.

Ribeiro, J. F., et al. "Lithium cobalt oxide crystallization on flexible polyimide substrate." Journal of Materials Science: Materials in Electronics 27 (2016): 631-636.

Office Action received for Japanese Patent Application No. 2022-528153, mailed on Jul. 25, 2023, 7 pages (3 pages of English Translation and 4 pages of Original Document).

Akazawa, "Highly adhesive Pt-electrode films directly deposited on SiO2 by electron-cyclotron-resonance plasma sputtering", Surface & Coatings Technology, vol. 204, 2010, pp. 1836-1841.

Combined Search and Examination Report Received for GB Application No. 1916628.9, mailed on May 5, 2020, 6 pages.

Combined Search and Examination Report Received for GB Application No. 1916632.1, mailed on May 5, 2020, 3 pages.

Combined Search and Examination Report Received for GB Application No. 1916633.9, mailed on May 4, 2020, 3 pages.

Combined Search and Examination Report Received for GB Application No. 1916634.7, mailed on May 15, 2020, 3 pages.

Combined Search and Examination Report Received for GB Application No. 1916635.4, mailed on May 5, 2020, 4 pages.

GB Search Report received for Application No. 1916619.8, mailed on May 7, 2020, 1 page.

GB Search Report received for Application No. 1916622.2, mailed on Mar. 30, 2020, 1 page.

GB Search Report received for Application No. 1916624.8, mailed on Apr. 29, 2020, 1 Page.

GB Search Report Received for GB Application No. 1916626.3, mailed on May 12, 2020, 1 page.

GB Search Report Received for GB Application No. 1916629.7, mailed on May 15, 2020, 1 page.

GB Search Report received for Patent Application No. 1916627.1, mailed on May 12, 2020, 1 page.

GB Search Report received for Patent Application No. 1916637.0, mailed on Mar. 30, 2020, 1 Page.

Hayashi et al., "Preparation of positive LiCoO2 films by electron cyclotron resonance (ECR) plasma sputtering method and its application to all-solid-state thin-film lithium batteries", Journal of Power Sources vol. 174, 2007, pp. 990-995.

International Search Report and Written Opinion received for PCT Patent Application No. PCT/GB20/052837, mailed on Feb. 12, 2021, 11 pages.

International Search Report and Written Opinion received for PCT Patent Application No. PCT/GB2020/052839, mailed on Feb. 23, 2021, 11 pages.

International Search Report and Written Opinion received for PCT Patent Application No. PCT/GB2020/052840, mailed on Feb. 25, 2021, 11 pages.

International Search Report and Written Opinion received for PCT Patent Application No. PCT/GB2020/052841, mailed on Mar. 1, 2021, 13 pages.

International Search Report and Written Opinion received for PCT Patent Application No. PCT/GB2020/052842, mailed on Feb. 25, 2021, 11 pages.

International Search Report and Written Opinion received for PCT Patent Application No. PCT/GB2020/052843, mailed on Feb. 26, 2021, 13 pages.

International Search Report and Written Opinion received for PCT Patent Application No. PCT/GB2020/052844, mailed on Feb. 18, 2021, 12 pages.

International Search Report and Written Opinion received for PCT Patent Application No. PCT/GB2020/052848, mailed on Dec. 23, 2020, 10 pages.

International Search Report and Written Opinion received for PCT Patent Application No. PCT/GB2020/052892, mailed on Feb. 25, 2021, 12 pages.

International Search Report and Written Opinion received for PCT Patent Application No. PCT/GB2020/052894, mailed on Mar. 9, 2021, 13 pages.

International Search Report and Written Opinion received for PCT Patent Application No. PCT/GB2020/052895, mailed on Mar. 5, 2021, 12 pages.

International Search Report and Written Opinion received for PCT Patent Application No. PCT/GB2020/052897, mailed on Mar. 3, 2021, 12 pages.

Julien E. et al., "Sputtered LiCoO2 Cathode Materials for All-solid-state Thin-film Lithium Microbatteries," Materials, vol. 12, No. 17, 2019, 2687, pp. 26.

Knox-Davies et al., "Properties of nanocrystalline GaN films deposited by reactive sputtering," Diamond and Related Materials, Elsevier Science Publishers, vol. 12, No. 8, 2003, pp. 1417-1421.

Office Action received for Japanese Patent Application No. 2022-528191, mailed on Jun. 27, 2023, 14 pages (8 pages of English Translation and 6 pages of Original Document).

Office Action received for Japanese Patent Application No. 2022-528195, mailed on Jun. 27, 2023, 11 pages (6 pages of English Translation and 5 pages of Original Document).

Office Action received for Japanese Patent Application No. 2022-528167, mailed on Aug. 29, 2023, 2 pages of Original Document Only.

* cited by examiner

METHOD AND APPARATUS FOR SPUTTER DEPOSITION OF TARGET MATERIAL TO A SUBSTRATE

CROSS-REFERENCE TO PRIOR APPLICATION

This application is a § 371 National Stage Application of PCT International Application No. PCT/GB2020/052839 filed Nov. 10, 2020, which claims the priority of United Kingdom Application No. 1916622.2, filed Nov. 15, 2019, each of which are herein incorporated by reference in their entirety.

TECHNICAL FIELD

The present invention relates to deposition, and more particularly to methods and apparatuses for sputter deposition of target material to a substrate.

BACKGROUND

Deposition is a process by which target material is deposited on a substrate. An example of deposition is thin film deposition in which a thin layer (typically from around a nanometre or even a fraction of a nanometre up to several micrometres or even tens of micrometres) is deposited on a substrate, such as a silicon wafer or web. An example technique for thin film deposition is Physical Vapor Deposition (PVD), in which target material in a condensed phase is vaporised to produce a vapor, which vapor is then condensed onto the substrate surface. An example of PVD is sputter deposition, in which particles are ejected from the target as a result of bombardment by energetic particles, such as ions. In examples of sputter deposition, a sputter gas, such as an inert gas, such as Argon, is introduced into a vacuum chamber at low pressure, and the sputter gas is ionised using energetic electrons to create a plasma. Bombardment of the target by ions of the plasma eject target material which may then deposit on the substrate surface. Sputter deposition has advantages over other thin film deposition methods such as evaporation in that target materials may be deposited without the need to heat the target material, which may in turn reduce or prevent thermal damage to the substrate.

A known sputter deposition technique employs a magnetron, in which a glow discharge is combined with a magnetic field that causes an increase in plasma density in a circular shaped region close to the target. The increase of plasma density can lead to an increased deposition rate. However, use of magnetrons results in a circular "racetrack" shaped erosion profile of the target, which limits the utilisation of the target and can negatively affect the uniformity of the resultant deposition.

It is desirable to provide uniform and/or efficient sputter deposition to allow for improved utility in industrial applications.

SUMMARY

According to a first aspect of the present invention, there is provided an apparatus for sputter deposition of target material to a substrate, the apparatus comprising:

a substrate guide arranged to guide a substrate along a curved path;

a target portion spaced from the substrate guide and arranged to support target material, the target portion and the substrate guide defining between them a deposition zone; and a confining arrangement comprising one or more magnetic elements arranged to provide a confining magnetic field to confine plasma in the deposition zone thereby to provide for sputter deposition of target material to the web of substrate in use, the confining magnetic field being characterised by magnetic field lines arranged to, at least in the deposition zone, substantially follow a curve of the curved path so as to confine said plasma around said curve of the curved path.

By guiding the substrate along the curved path, the apparatus for example provides for compact sputter deposition of a target material on a large surface area of a substrate in a "reel-to-reel" type system. A reel-to-reel deposition system may be more efficient than a batch process, which may involve ceasing deposition in between batches.

With the magnetic field lines substantially following the curve of the curved path, the plasma may be confined round the curve path into the deposition zone. The density of the plasma may therefore be more uniform in the deposition zone, at least in a direction around the curve of the curved path. This may increase the uniformity of the target material deposited on the substrate. The consistency of the processed substrate may therefore be improved, reducing the need for quality control.

In examples, the one or more magnetic elements are arranged provide the confining magnetic field so as to confine plasma in the form of a curved sheet. By confining the plasma in the form of a curved sheet, an increased area of the substrate may be exposed to the plasma. The sputter deposition may therefore be performed over a larger surface area of the substrate, which may improve the efficiency of the sputter deposition. By providing a curved sheet of plasma, the density of the plasma may be more uniform. The uniformity of the plasma may be increased around the curve of the curved path and over the width of the substrate. This may allow for more uniform sputter deposition of the target material onto the substrate.

In examples, the one or more magnetic elements are arranged to provide the confining magnetic field so as to confine plasma in the form of a curved sheet having, at least in the deposition zone, a substantially uniform density. With a substantially uniform density of plasma in the deposition zone, the target material may be deposited on the substrate with a substantially uniform thickness. This may improve the consistency of the substrate after deposition, and reduce the need for quality control.

In examples, one or more of the magnetic elements is an electromagnet. Using an electromagnet allows the strength of the confining magnetic field to be controlled. For example, the apparatus may comprise a controller arranged to control the magnetic field provided by one or more of the electromagnets. In this way, a density of the plasma in the deposition zone may be adjusted, which may be used to adjust deposition of the target material on the substrate. Hence, control over the sputter deposition may be improved, improving the flexibility of the apparatus.

In examples, one or more of the magnetic elements is in the form of a solenoid, the solenoid being elongate in a direction substantially perpendicular to a direction of the magnetic field lines produced internally thereof in use. With such an arrangement, the plasma may be confined by the elongate solenoid along a greater length than otherwise, e.g. in the form of a sheet. This may allow for an increased area of the substrate and/or target material to be exposed to the plasma. This may increase the efficiency of sputter deposition and may alternatively or additionally provide for more uniform deposition of the target material on the substrate.

In examples, the confining arrangement comprises at least two of the magnetic elements arranged to provide the confining magnetic field. This may allow for more precise confinement of the plasma, and/or may allow for a greater degree of freedom in control of the confining magnetic field. For example, having at least two magnetic elements may increase an area of the substrate that is exposed to the plasma and hence increase an area of the substrate on which the target material is deposited. This may improve the efficiency of the sputter deposition process. In these examples, the at least two magnetic elements may be arranged such that a region of relatively high magnetic field strength provided between the magnetic elements substantially follows the curve of the curved path. This may increase the uniformity of the plasma around the curve of the curved path, which in turn may increase the uniformity of the target material sputter deposited on the substrate.

In examples, the magnetic field lines characterising the confining magnetic field are each curved so as to, at least in the deposition zone, substantially follow the curve of the curved path. The magnetic field lines substantially following the curve of the curved path may confine the plasma around the curve of the curved path, as the plasma may tend to follow the magnetic field lines. This may provide for a more uniform distribution of the plasma at least around the curve of the curved path. This may provide for more uniform sputter deposition of the target material on the substrate at least in a direction around the curve of the curved path. In these examples, one or more of the magnetic elements may comprise a solenoid, the solenoid having an opening via which plasma is confined in use, the opening being elongate in a direction substantially parallel to a longitudinal axis of the substrate guide. Confining the plasma via the opening of the solenoid may increase the density of the plasma within the deposition zone. For example, a quantity of plasma may be compressed or otherwise constricted to pass through the opening of the solenoid. With such an arrangement, the plasma may be confined across a wider area than otherwise, e.g. that corresponds to the elongate opening of the solenoid. For example, the plasma may be confined by the elongate opening of the solenoid in the form of a sheet. The plasma may be more uniform than otherwise. Additionally or alternatively, with the plasma confined by the elongate opening of the surface, a larger surface area of the substrate and/or target material may be exposed to the plasma than otherwise. This may increase the efficiency of the sputter deposition process. In these examples, the apparatus may comprise a plasma generation arrangement arranged to generate plasma, wherein the plasma generation arrangement comprises one or more elongate antennae that extend in a direction substantially parallel to a longitudinal axis of the substrate guide. With this arrangement, the plasma may be generated along the length of the one or more elongate antennae, which may allow an increased area of the substrate and/or target material to be exposed to the plasma. This may increase the efficiency of sputter deposition and may alternatively or additionally provide for more uniform deposition of the target material on the substrate.

In examples, the magnetic field lines characterising the confining magnetic field are arranged such that an imaginary line, extending perpendicularly to each magnetic field line and connecting the magnetic field lines, is curved so as to, at least in the deposition zone, substantially follow the curve of the curved path. With this arrangement of magnetic field lines, the plasma may take the form of a curved sheet, which extends across a greater width of the deposition zone than otherwise but which is curved around the curved path along which the substrate is guided. This may increase exposure of the substrate and/or target material to the plasma, which may increase the efficiency with which the target material is sputter deposition on the substrate. With the imaginary line being curved to, at least in the deposition zone, substantially follow the curve of the curved path, the plasma may be more uniform around the curve of the curved path. This may improve the uniformity of the target material sputter deposited on the substrate. In these examples, one or more of the magnetic elements may comprise a solenoid, the solenoid having an opening through which plasma is confined in use, the opening being curved and elongate in a direction substantially perpendicular to a longitudinal axis of the substrate guide. The curved, elongate opening of the solenoid may improvement the confinement of the plasma in the form of a curved sheet. The density of the plasma in the deposition zone may be increased due to the confinement of the plasma through the opening of the solenoid. The plasma may be confined more uniformly along the length of the solenoid and with a more uniform distribution around the curve of the curved path. This may improve the uniformity of the target material sputter deposited on the substrate. In these examples, the apparatus may further comprise a plasma generation arrangement arranged to generate plasma, wherein the plasma generation arrangement comprises one or more elongate antennae that are curved and extend in a direction substantially perpendicular to a longitudinal axis of the substrate guide. The elongate antennae may be used to generate an elongate, curved, sheet of plasma, along the length of the elongate antennae. This may allow an increased area of the substrate and/or target material to be exposed to the plasma. This may increase the efficiency of sputter deposition and may alternatively or additionally provide for more uniform deposition of the target material on the substrate.

In examples, the target portion is arranged, or is configurable to be arranged, such that at least one part of the target portion defines a supporting surface forming an obtuse angle with respect to a supporting surface of another part of the target portion. This may allow for an increased area in which sputter deposition may be effected, but without increasing the spatial footprint of the target portion and without altering the curved path. This may increase the efficiency of the sputter deposition.

In examples, the target portion is substantially curved. This may increase a surface area of the target portion exposed to the substrate within the deposition zone, which may increase the efficiency with which the sputter deposition may be effected, and may be more compact than other arrangements.

In examples, the target portion is arranged to substantially follow or approximate the curve of the curved path. This may improve the uniformity with which the target material of the target portion is sputter deposited on the substrate, along the curve of the curved path. This may reduce the need for quality control.

In examples, the substrate guide is provided by a curved member that guides a web of substrate along the curved path. The web of substrate may be guided by rotation of the curved member, which may be a roller or drum. In this way, the apparatus may form part of a "reel-to-reel" process arrangement, which may process a substrate more efficiently than a batch processing arrangement.

According to a second aspect of the present invention, there is provided a method of sputter deposition of target material to substrate, the substrate being guided by a substrate guide along a curved path, wherein a deposition zone is defined between the substrate guide and a target portion supporting target material, the method comprising:

providing a magnetic field to confine plasma in the deposition zone thereby to cause sputter deposition of target material to the web of substrate, the magnetic field being characterised by magnetic field lines arranged to, at least in the deposition zone, substantially follow a curve of the curved path so as to confine said plasma around the curved path.

This method may increase the uniformity of the plasma around the curve of the curved path, which may in turn increase the uniformity of the target material deposited on the web of substrate. By using the curved path, the method may be implemented as a reel-to-reel type process, which may be performed more efficiently than batch processes.

According to a third aspect of the present invention, there is provided an apparatus comprising:

a plasma processing zone; and a confining arrangement comprising one or more magnetic elements arranged to provide a confining magnetic field to confine plasma in the plasma processing zone thereby to provide for a plasma process in use, the confining magnetic field being characterised by magnetic field lines arranged to, at least in the plasma processing zone, substantially follow a curved path so as to confine said plasma around said curve of the curved path.

This apparatus may increase the uniformity of the plasma around the curve of the curved path. The output of the plasma process provided by the plasma may therefore be more consistent than otherwise.

Further features will become apparent from the following description, given by way of example only, which is made with reference to the accompanying drawings.

DETAILED DESCRIPTION

Figure 1:
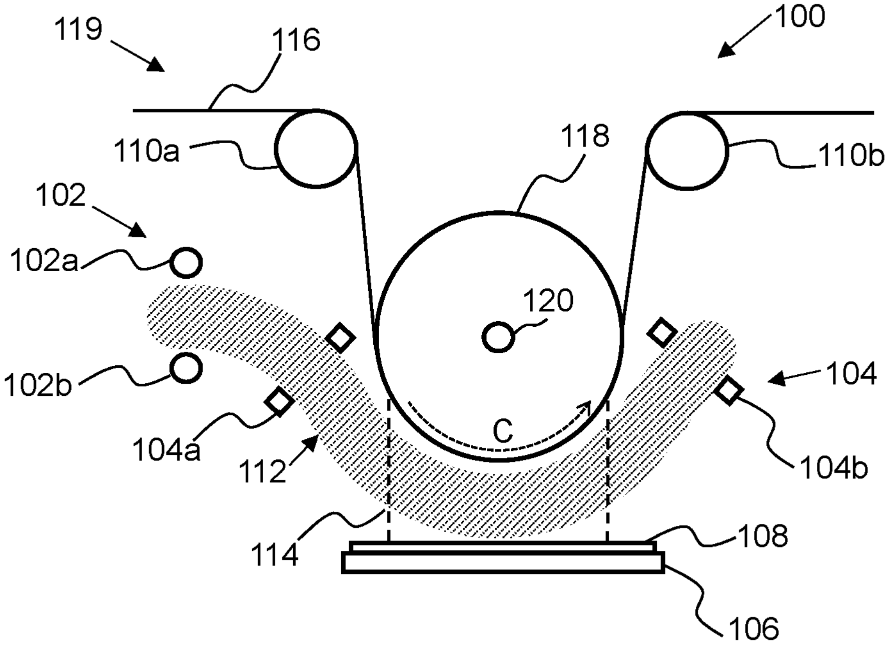
FIG. 1 is a schematic diagram that illustrates a cross section of an apparatus according to an example.

Details of apparatuses and methods according to examples will become apparent from the following description, with reference to the Figures. In this description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Referring to FIGS. 1 to 5, an example apparatus 100 for sputter deposition of target material 108 to a substrate 116 is illustrated.

The apparatus 100 may be used for plasma-based sputter deposition for a wide number of industrial applications, such as those which have utility for the deposition of thin films, such as in the production of optical coatings, magnetic recording media, electronic semiconductor devices, LEDs, energy generation devices such as thin-film solar cells, and energy storage devices such as thin-film batteries. Therefore, while the context of the present disclosure may in some cases relate to the production of energy storage devices or portions thereof, it will be appreciated that the apparatus 100 and method described herein are not limited to the production thereof.

Although not shown in the Figures for clarity, it is to be appreciated that the apparatus 100 may be provided within a housing (not shown), which in use may be evacuated to a low pressure suitable for sputter deposition, for example $3\times10^{-3}$ torr. For example, the housing (not shown) may be evacuated by a pumping system (not shown) to a suitable pressure (for example less than 1×10−5 torr), and in use a process or sputter gas, such as argon or nitrogen, may be introduced into the housing (not shown) using a gas feed system (not shown) to an extent such that a pressure suitable for sputter deposition is achieved (for example 3×10−3 torr).

Returning to the example illustrated in FIGS. 1 to 5, in broad overview, the apparatus 100 comprises a substrate guide 118, a target portion 106, and a magnetic confining arrangement 104.

Figure 2:
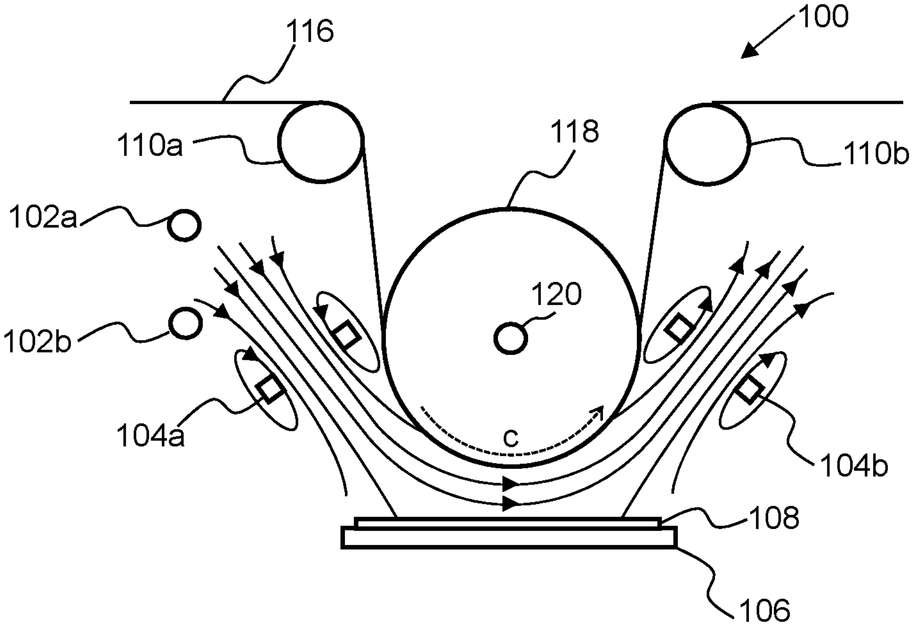
FIG. 2 is a schematic diagram that illustrates a cross section of the example apparatus of FIG. 1, but including illustrative magnetic field lines.

The substrate guide 118 is arranged to guide a web of substrate 116 along a curved path (the curved path being indicated by arrow C in FIGS. 1 and 2).

Figure 3:
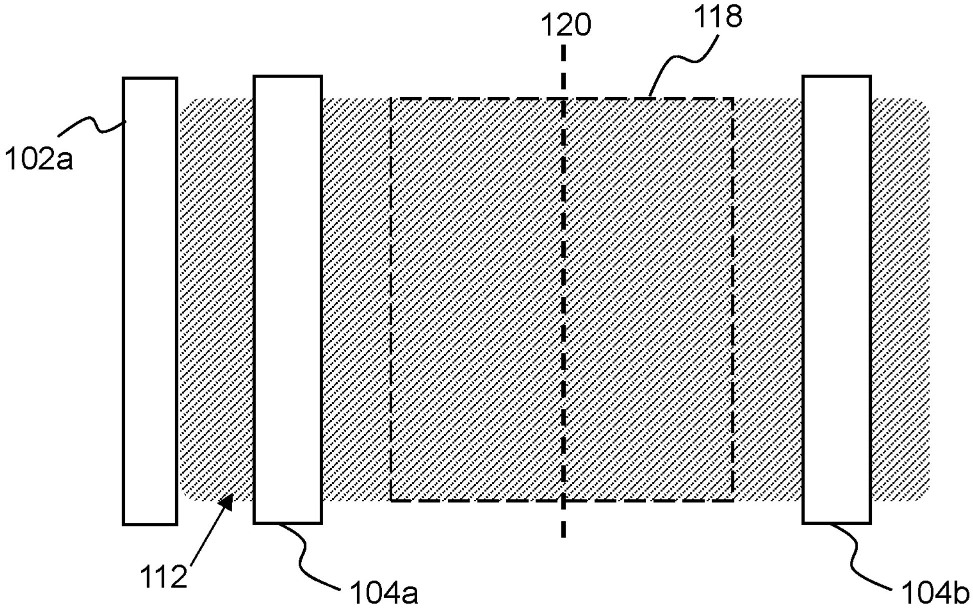
FIG. 3 is a schematic diagram that illustrates a plan view of a portion of the example apparatus of FIGS. 1 and 2.

In some examples, the substrate guide 118 may be provided by a curved member 118. The curved member 118 may be arranged to rotate about an axis 120, for example provided by an axle 120. As per the example illustrated in FIG. 3, the axis 120 may be also a longitudinal axis of the curved member 118. In some examples, as illustrated in FIG. 3, the curved member 118 may be provide by a substantially cylindrical drum or roller 118 of an overall web feed assembly 119. The web feed assembly 119 may be arranged to feed the web of substrate 116 onto and from the roller 118 such that the web of substrate 116 is carried by at least part of a curved surface of the roller 118. In some examples, the web feed assembly comprises a first roller 110*a* arranged to feed the web of substrate 116 onto the drum 118, and a second roller 110*b* arranged to feed the web of substrate 116 from the drum 118, after the web of substrate 116 has followed the curved path C. The web feed assembly 119 may be part of a "reel-to-reel" process arrangement (not shown), where the web of substrate 116 is fed from a first reel or bobbin (not shown) of substrate web 116, passes through the apparatus 100, and is then fed onto a second reel or bobbin (not shown) to form a loaded reel of processed substrate web (not shown).

In some examples, the web of substrate 116 may be or comprise silicon or a polymer. In some examples, for example for the production of an energy storage device, the web of substrate 116 may be or comprise nickel foil, but it will be appreciated that any suitable metal could be used instead of nickel, such as aluminium, copper or steel, or a metallised material including metallised plastics such as aluminium on polyethylene terephthalate (PET).

The target portion 106 is arranged to support the target material 108.

In some examples, the target portion 106 may comprise a plate or other support structure that supports or holds the target material 108 in place during sputter deposition. The target material 108 may be a material on the basis of which the sputter deposition onto the substrate 116 is to be performed. For example, the target material 108 may be or comprise material that is to be deposited onto the web of substrate 116 by sputter deposition.

In some examples, for example for the production of an energy storage device, the target material 108 may be or comprise, or may be or comprise a precursor material for, a cathode layer of an energy storage device, such as a material which is suitable for storing Lithium ions, such as Lithium Cobalt Oxide, Lithium Iron Phosphate or alkali metal polysulphide salts. Additionally or alternatively, the target material 108 may be or comprise, or may be or comprise a precursor material for, an anode layer of an energy storage device, such as Lithium metal, Graphite, Silicon or Indium Tin Oxides. Additionally or alternatively, the target material 108 may be or comprise, or may be or comprise a precursor material for, an electrolyte layer of an energy storage device, such as material which is ionically conductive, but which is also an electrical insulator, such as lithium phosphorous oxynitride (LiPON). For example, the target material 108 may be or comprise LiPO as a precursor material for the deposition of LiPON onto the substrate 116, for example via reaction with Nitrogen gas in the region of the target material 108.

The target portion 106 and the substrate guide 118 are spaced apart from one another and define between them a deposition zone 114. The deposition zone 104 may be taken as the area or volume between the substrate guide 118 and the target portion 106 in which sputter deposition from the target material 108 onto the web of substrate 116 occurs in use.

In some examples, such as those illustrated, the apparatus may comprise a plasma generation arrangement 102. The plasma generation arrangement 102 is arranged to generate plasma 112.

In some examples, the plasma generation arrangement 102 may comprise one or more antennae 102*a*, 102*b* through which appropriate radio frequency power may be driven by a radio frequency power supply system (not shown) so as to generate an inductively coupled plasma 112 from the process or sputter gas in the housing (not shown). In some examples, plasma 112 may be generated by driving a radio frequency current through the one or more antennae 102*a*, 102*b*, for example at a frequency between 1 MHz and 1 GHz; a frequency between 1 MHz and 100 MHz; a frequency between 10 MHz and 40 MHz; or at a frequency of approximately 13.56 MHz or multiples thereof. The radio frequency power causes ionisation of the process or sputter gas to produce plasma 112.

In some examples, the plasma generation arrangement 102 may be disposed remotely of the substrate guide 118. For example, the plasma generation arrangement 102*a* may be disposed at a distance radially away from the substrate guide 118. As such, plasma 112 may be generated remotely of the substrate guide 118, and remotely from the deposition zone 114.

In some examples, the one or more antennae 102*a*, 102*b* may each be elongate antennae and extend in a direction substantially parallel to the longitudinal axis 120 of the substrate guide 108 (e.g. the axis 120 of the drum 108 which passes through the origin of the radius of curvature of the curved drum 108). In the example of FIG. 1, the longitudinal axis 120 of the drum 118 is also the rotation axis of the drum 118.

In some examples, the plasma generation arrangement 102 comprises two antennae 102*a*, 102*b* for producing an inductively coupled plasma 112. In some examples (e.g. as illustrated in FIG. 3), the antennae 102*a*, 102*b* are elongate and substantially linear and extend parallel to the longitudinal axis 120 (which may also be the rotation axis 120 of the curved member 118). The antennae 102*a*, 102*b* may extend substantially parallel to one another and may be disposed laterally from one another. This may allow for a precise generation of an elongate region of plasma 112 between the two antennae 102*a*, 102*b*, which may in turn help provide for precise confining of the generated plasma 112 to the deposition zone 114, as described in more detail below. In some examples, the antennae 120*a*, 120*b* may be similar in length to the substrate guide 118, and accordingly similar to the width of the web of substrate 116 carried by the substrate guide 118. The elongate antennae 102*a*, 102*b* may provide for plasma 112 to be generated across a region having a length corresponding to the length of the substrate guide 118 (and hence corresponding to the width of the web of substrate 116), and hence may allow for plasma 112 to be available evenly or uniformly across the width of the web of substrate 116. As described in more detail below, this may in turn help provide for even or uniform sputter deposition.

The confining arrangement 104 comprises one or more magnetic elements 104*a*, 104*b*. The magnetic elements 104*a*, 104*b* are arranged to provide a confining magnetic field to confine plasma 112 (e.g. the plasma generated by the plasma generation arrangement 102) into the deposition zone 114, in order to provide for sputter deposition of target material 108 to the web of substrate 116 in use. The confining magnetic field is characterised by magnetic field lines arranged to, at least in the deposition zone 114, substantially follow a curve of the curved path C so as to confine the plasma 112 around the curved path C.

It will be appreciated that magnetic field lines may be used to characterise or describe the arrangement or geometry of a magnetic field. As such it will be understood that the confining magnetic field provided by the magnetic elements 104*a*, 104*b* may be described or characterised by magnetic field lines arranged to follow a curve of the curved path C. It will also be appreciated that, in principle, the whole or entire magnetic field provided by the magnetic elements 103*a*, 104*b* may comprise portions which may be characterised by magnetic field lines which are not arranged to follow the curve of the curved path C Nonetheless, the confining magnetic field provided, i.e. the part of the entire or whole magnetic field provided by the magnetic elements 104*a*, 104*b* that confines the plasma into the deposition zone 114, is characterised by magnetic field lines that follow the curve of the curved path C.

The curve of the curved path C may be understood as the degree to which the path along which the substrate guide 118 carries the web of substrate is curved. For example, the substrate guide 118 may comprise a curved member 118, such as a drum 118, that carries the substrate 116 along the curved path C. In such examples, the curve of the curved path C may result from the degree to which the curved surface of the curved member 118 that carries the web of substrate 116 is curved, i.e. deviates from a flat plane. In other words, the curve of the curved path C may be understood as the degree to which the curved path C that the curved member 118 causes the web of substrate 116 to follow is curved. To substantially follow the curve of the curved path C may be understood as to substantially conform to or replicate the curved shape of the curved path C. For example, the magnetic field lines may follow a curved path that has a common centre of curvature with the curved path C, but which has a different, in the illustrated examples larger, radius of curvature than the curved path C. For example, the magnetic field lines may follow a curved path that is substantially parallel to but radially offset from the curved path C of the substrate 116. In examples where a curved member or drum 118 guides the substrate 116 on the curved path C, the magnetic field lines may follow a curved path that is substantially parallel to but radially offset from the curved surface of the curved member or drum 118. For example, the magnetic field lines characterising the confining magnetic field in FIG. 2 follow a curved path, at least in the deposition zone 114, that is substantially parallel to but radially offset from the curved path C, and hence which substantially follow the curve of the curved path C.

The magnetic field lines characterising the confining magnetic field may be arranged to follow the curve of the curved path C around a substantial or significant sector or portion of the curved path C, for example over all or a substantial part of the notional sector of the curved path C over which the substrate 116 is guided by the substrate guide 118. For example, the curved path C may represent a portion of a circumference of a notional circle, and magnetic field lines characterising the confining magnetic field may be arranged to follow the curve of the curved path C around at least about 1/16 or at least about 1/8 or at least about 1/4 or at least about 1/2 of the circumference of the notional circle.

In examples where the substrate guide 118 is provided by a curved member or drum 118, the magnetic field lines characterising the confining magnetic field may be arranged to follow a curve of the curved member or drum 118 around a substantial or significant sector or portion of the curved member 118, for example over all or a substantial part of the notional sector of the curved member 118 that carries or contacts the web of substrate 116 in use. For example, the curved member 118 may be substantially cylindrical in shape, and magnetic field lines characterising the confining magnetic field may be arranged to follow the curve of the curved member 118 around at least about 1/16 or at least about 1/8 or at least about 1/4 or at least about 1/2 of the circumference of the curved member 118. For example, the magnetic field lines characterising the confining magnetic field in FIG. 2 follow a curved path around about at least 1/4 of the circumference of the curved member 118.

Figure 4:
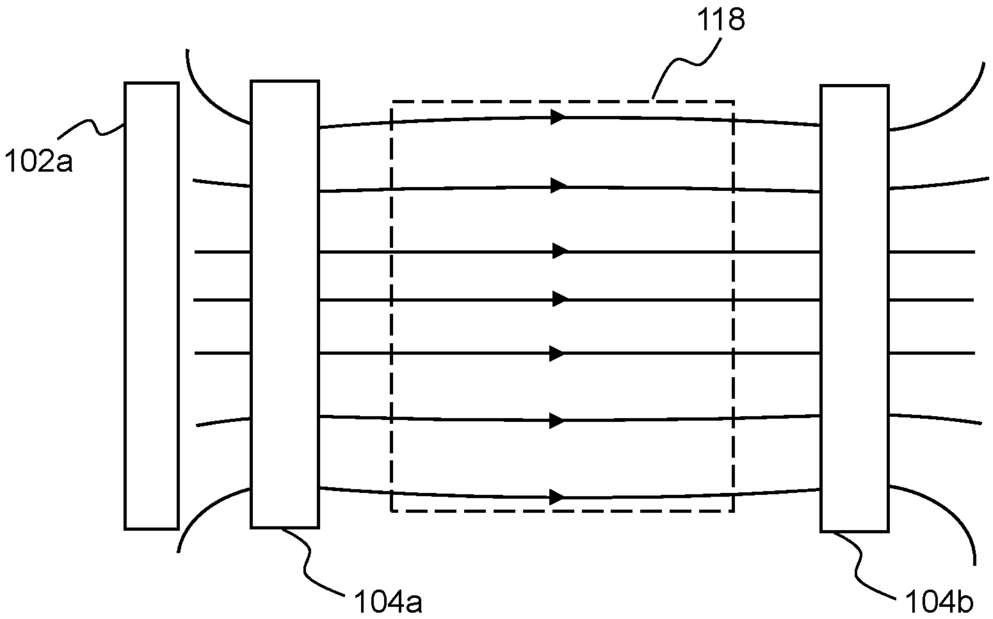
FIG. 4 is a schematic diagram that illustrates a plan view of the portion of the example apparatus of FIG. 3, but including illustrative magnetic field lines.

An example magnetic field provided by example the magnetic elements 103*a*, 104*b* is illustrated schematically in FIGS. 2 and 4, where magnetic field lines (indicated as is convention by arrowed lines) are used to characterise or describe the magnetic field provided in use. As mentioned, there are some magnetic field lines which do not substantially follow the curvature of the curved member, but the confining magnetic field, i.e. that which confines the plasma into the deposition zone, is characterised by magnetic field lines arranged to follow the curve of the curved path C. As best seen in FIGS. 2 and 4, the magnetic field lines characterising the confining magnetic field may each be curved so as to, at least in the deposition zone 114, substantially follow the curve of the curved path C.

The magnetic field lines being arranged to follow the curve of the curved path C of the substrate 116 confines the generated plasma 112 around the curve of the curved path C into the deposition zone 114. This occurs because the generated plasma 112 tends to follow the magnetic field lines. For example, ions of the plasma within the confining magnetic field and with some initial velocity will experience a Lorentz force that causes the ion to follow a periodic motion around the magnetic field line. If the initial motion is not strictly perpendicular to the magnetic field, the ion follows a helical path centred on the magnetic field line. The plasma containing such ions therefore tends to follow the magnetic field lines and hence is confined on a path defined thereby. Accordingly, since the magnetic field lines are arranged to substantially follow a curve of the curved path C, the plasma 112 will be confined so as to substantially follow a curve of the curved path C, and hence be confined around the curve of the curved path C into the deposition zone 114.

Confining the generated plasma 112 so as to substantially follow a curve of the curved path C may allow for more uniform distribution of plasma density at the web of substrate 116 at least in a direction around curve of the curved path C. This may in turn allow for a more uniform sputter deposition onto the web of substrate 116 in a direction around the curved path C. The sputter deposition may therefore, in turn, be performed more consistently. This may, for example, improve the consistency of the processed substrate, and may for example, reduce the need for quality control. This may be as compared to, for example, magnetron type sputter deposition apparatuses where the magnetic field lines characterising the magnetic field produced thereby loop tightly into and out of a substrate, and hence do not allow to provide uniform distribution of plasma density at the substrate.

Alternatively or additionally, confining the generated plasma 112 so as to substantially follow a curve of the curved path C may allow for an increased area of the substrate 116 to be exposed to the plasma 112, and hence for an increased area in which sputter deposition may be effected. This may allow, for example, for the web of substrate 116 to be fed through a reel-to-reel type apparatus at a faster rate for a given degree of deposition, and hence for more efficient sputter deposition.

In some examples, the magnetic confining arrangement 104 may comprise at least two of the magnetic elements 104*a*, 104*b* arranged to provide the magnetic field. For example, the at least two magnetic elements 104*a*, 104*b* may be arranged such that a region of relatively high magnetic field strength provided between the magnetic elements 104*a*, 104*b* substantially follows the curve of the curved path C. In the example illustrated schematically in FIGS. 1 and 2, there are two magnetic elements 104*a*, 104*b* located on opposite sides of the drum 118 to one another, and each is disposed above a lowermost portion of the drum 118 (in the sense of FIG. 1). The magnetic elements 104*a*, 104*b* confine the plasma 112 to follow the curve of the curved path C on both sides of the drum 118, for example a feed-on side where the web of substrate 116 is fed onto the drum 118, and a feed-off side in where the web of substrate 116 is fed off of the drum 118. Having at least two magnetic elements may therefore provide for a (further) increase in the area of the substrate 116 that is exposed to plasma, and hence increased area in which sputter deposition may be effected. This may allow, for example, for the web of substrate 116 to be fed through a reel-to-reel type apparatus at a (still) faster rate for a given degree of deposition, and hence for more efficient sputter deposition.

In some examples, one or more of the magnetic elements 104*a*, 104*b* may be an electromagnet 104*a*, 104*b*. The apparatus 100 may comprise a controller (not shown) arranged to control a strength of the magnetic field provided by one or more of the electromagnets 104*a*, 104*b*. This may allow for the arrangement of the magnetic field lines characterising the confining magnetic field to be controlled. This may allow for adjustment of the plasma density at the substrate 116 and or the target material 108 and hence for improved control over the sputter deposition. This may allow for improved flexibility in the operation of the apparatus 100.

In some examples, one or more of the magnetic elements 104*a*, 104*b* may be provided by a solenoid 104*a*, 104*b*. Each solenoid 104*a*, 104*b* may define an opening through which plasma 112 passes (is confined) in use. As per the example illustrated schematically in FIGS. 1 and 2, there may be two solenoids 104*a*, 104*b* and each solenoid 104*a*, 104*b* may be angled so that a region of relatively high magnetic field strength provided between the solenoids 104*a*, 104*b* substantially follows the curve of the curved path C. In such a way, as illustrated in FIG. 1, the generated plasma 112 may pass through a first of the solenoids 104*a*, under the drum 118 (in the sense of FIG. 1) into the deposition zone 114, and up towards and through the second of the solenoids 104*b*. Although only two magnetic elements 104*a*, 104 are shown in FIGS. 1 and 2, it will be appreciated that further magnetic elements (not shown), for example further such solenoids (not shown) may be placed along the curved path of the plasma 112. This may allow for strengthening of the confining magnetic field and hence for precise confining and/or may allow for more degrees of freedom in the control of the confining magnetic field.

In some examples, the one or more magnetic elements 104*a*, 104*b* are arranged to provide the magnetic field so as to confine the plasma 112 in the form of a curved sheet. In some examples, the one or more magnetic elements 104*a*, 104*b* are arranged to provide the magnetic field so as to confine the plasma 112 in the form of a curved sheet having, at least in the deposition zone 114, a substantially uniform density.

Figure 5:
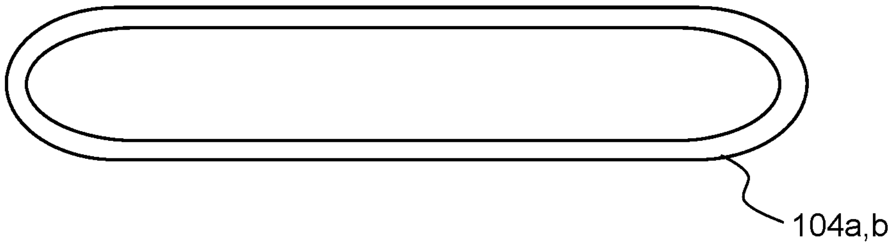
FIG. 5 is a schematic diagram that illustrates a cross section of a magnetic element according to an example.

For example, as illustrated in FIGS. 4 and 5, in some examples one or more of the solenoids 104*a*, 104*b* may be elongate in a direction substantially perpendicular to a direction of the magnetic field lines produced internally thereof in use. For example, as perhaps best seen in FIGS. 3 to 5, the solenoids 104*a*, 104*b* may each have an opening via which plasma 112 is confined in use (through which plasma 112 passes in use), where the opening is elongate in a direction substantially parallel to a longitudinal axis 120 of the curved member 118. As perhaps best seen in FIGS. 3 and 4, the elongate antennae 102*a*, 102*b* may extend parallel to and in line with the solenoids 104*a*, 104*b*. As described above, plasma 112 may be generated along the length of the elongate antennae 102*a*, 102*b*, and the elongate solenoid 104*a* may confine the plasma 112 in a direction away from the elongate antennae 102*a*, 102*b*, and through the elongate solenoid 104*a*.

The plasma 112 may be confined from the elongate antennae 102*a*, 102*b* by the elongate solenoid 104*a* in the form of a sheet. That is, in a form in which the depth (or thickness) of the plasma 112 is substantially less than its length or width. The thickness of the sheet of plasma 112 may be substantially constant along the length and width of the sheet. The density of the sheet of plasma 112 may be substantially uniform in one or both of its width and length directions. The plasma 112, in the form of a sheet, may be confined by the magnetic field provided by the solenoids 104*a*, 104*b* around the curved member 118 so as to follow the curve of the curved path C, into the deposition zone 114. The plasma 112 may thereby be confined in the form of a curved sheet. The thickness of the curved sheet of plasma 112 may be substantially constant along the length and width of the curved sheet. The plasma 112 in the form of a curved sheet may have a substantially uniform density, for example the density of the plasma 112 in the form of a curved sheet may be substantially uniform in one or both of its length and width.

Confining the plasma in the form of a curved sheet may allow for an increased area of the substrate 116 carried by the curved member 118 to be exposed to the plasma 112, and hence for an increased area in which sputter deposition may be effected. This may allow, for example, for the web of substrate 116 to be fed through a reel-to-reel type apparatus at a (still) faster rate for a given degree of deposition, and hence for more efficient sputter deposition.

Confining the plasma 112 in the form of a curved sheet, for example a curved sheet having, at least in the deposition zone 114, a substantially uniform density, may alternatively or additionally allow for a more uniform distribution of plasma density at the web of substrate 116, for example in both of a direction around the curve of the curved member 118, and over the length of the curved member 118. This may in turn allow for a more uniform sputter deposition onto the web of substrate 116, e.g. in a direction around the surface of the curved member and across the width of the substrate 116. The sputter deposition may therefore, in turn, be performed more consistently. This may, for example, improve the consistency of the processed substrate, and may for example, reduce the need for quality control. This may be as compared to, for example, magnetron type sputter deposition apparatuses where the magnetic field lines characterising the magnetic field produced thereby loop tightly into and out of a substrate, and hence do not allow to provide uniform distribution of plasma density at the substrate.

In some examples, the confined plasma 112 may, at least in the deposition zone 114, be high density plasma. For example, the confined plasma 112 (in the form of a curved sheet or otherwise) may have, at least in the deposition zone 114, a density of $10^{11}$ $cm^{-3}$ or more, for example. Plasma 112 of high density in the deposition zone 114 may allow for effective and/or high rate sputter deposition.

In the examples illustrated in FIGS. 1 to 5, the target portion 106 and the target material 108 supported thereby is substantially planar. However, in some examples (as described in more detail below) the target portion may be arranged, or may be configurable to be arranged, such that at least one part of the target portion defines a supporting surface forming an obtuse angle with respect to a supporting surface of another part of the target portion. For example, the target portion may be substantially curved. For example, the target portion may be arranged to substantially follow the curve of the curved path C.

Figure 6:
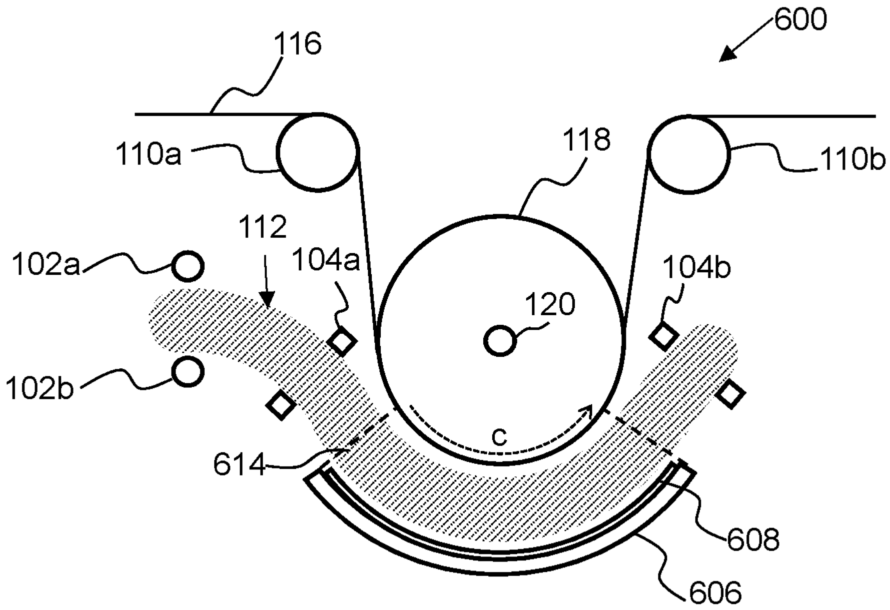
FIG. 6 is a schematic diagram that illustrates a cross section of an apparatus according to an example.

FIG. 6 illustrates an example apparatus 600. Many of the illustrated components of the apparatus 600 are the same as those of the apparatus 100 illustrated in FIGS. 1 to 5 and described above and will not be described again. Like features are given like reference signs, and it will be appreciated that any feature of the examples described with reference to FIGS. 1 to 5 may be applied to the example illustrated in FIG. 6. However, in the example illustrated in FIG. 6, the target portion 606 is substantially curved. In the example of FIG. 6, the target material 608 supported by the target portion 606 is accordingly substantially curved. In this case, any one part of the curved target portion 606 forms an obtuse angle with any other part of the curved target portion 606 along the direction of the curve. In some examples, different parts of the target portion 606 may support different target materials, for example to provide for a desired arrangement or composition of deposition to the web of substrate 116.

In some examples, the curved target portion 606 may substantially follow the curve of the curved path C. For example, the curved target portion 606 may substantially conform to or replicate the curved shape of the curved path C. For example, the curved target portion 606 may have a curve that is substantially parallel to but radially offset from the curved path. For example, the curve target portion 606 may have a curve that has a common centre of curvature to the curved path C, but a different, in the illustrated examples larger, radius of curvature to the curved path C. Accordingly, the curved target portion 606 may in turn substantially follow the curve of the curved plasma 112 confined around the curved member 118 in use. Put another way, in some examples, the plasma 112 may be confined by the magnetic elements 104*a*, 104*b* of the confining arrangement to be located between the path C of the substrate 116 and the target portion 606, and substantially follow the curve of both the curved path C and the curved target portion 606.

As for the target portion 108 of the apparatus 100 illustrated in FIGS. 1 to 5, it will be appreciated that the example target portion 606 of FIG. 6 (and accordingly the target material 608 supported thereby) may extend substantially across an entire length of the curved member 118 (e.g. in a direction parallel with the longitudinal axis 120 of the drum 118). This may allow to maximise the surface area of the web of substrate 116 carried by the drum 118 onto which target material 608 may be deposited.

As mentioned, the plasma 112 may be confined to substantially follow the curve of both the curved path C and the curved target portion 606. The area or volume between the curved path C and the curved target portion 606 may accordingly be curved around the curved member 118. The deposition zone 614 may therefore represent a curved volume in which sputter deposition of the target material 608 to the substrate 116 carried by the curved member 118 occurs in use. This may allow for an increase of the surface are of the web of substrate 116 carried by the curved member 118 present in the deposition zone 614 at any one time. This in turn may allow for an increase in the surface area of the web of substrate 116 onto which target material 608 may be deposited in use. This in turn may allow for an increased area in which sputter deposition may be effected, but without substantially increasing the spatial footprint of the target portion 606, and without altering the dimensions of the curved member 118. This may allow, for example, for the web of substrate 116 to be fed through a reel-to-reel type apparatus at a (still) faster rate for a given degree of deposition, and hence for more efficient sputter deposition, but also in a space efficient way.

Figure 7:
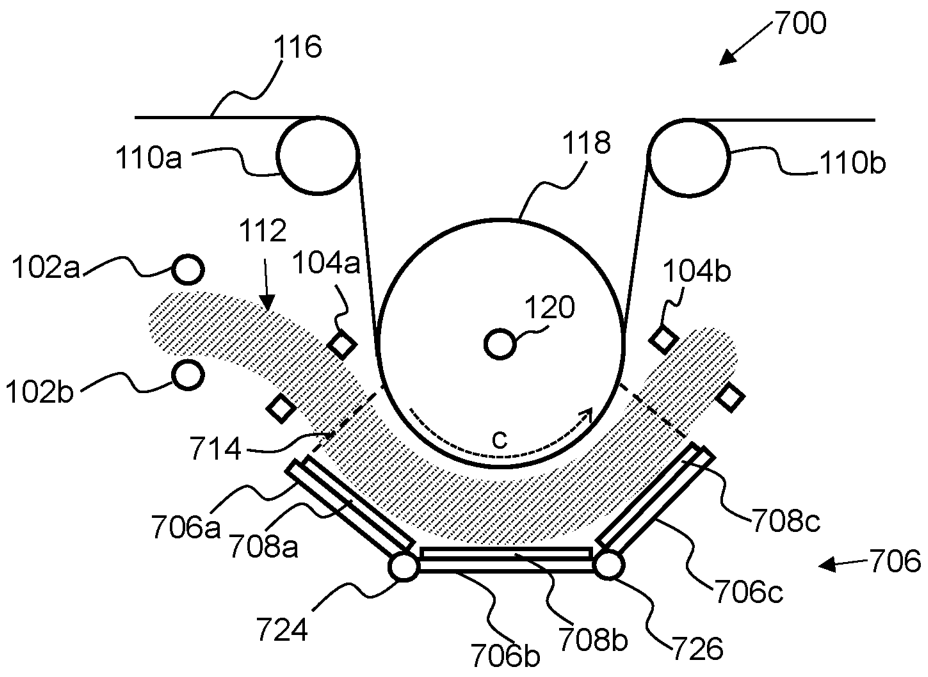
FIG. 7 is a schematic diagram that illustrates a cross section of an apparatus according to an example.

FIG. 7 illustrates an example apparatus 600. Many of the illustrated components of the apparatus 700 are the same as those of the apparatus 100 illustrated in FIGS. 1 to 5 and described above and will not be described again. Like features are given like reference signs, and it will be appreciated that any feature of the examples described with reference to FIGS. 1 to 6 may be applied to the example illustrated in FIG. 7. However, in the example illustrated in FIG. 7, the target portion 706 is arranged, or configurable to be arranged, such that at least one part 706*a* of the target portion 706 defines a surface forming an obtuse angle with respect to a surface of another part 708*b* of the target portion 706.

In some examples, an angle that a first part 706*a* of the target portion 706 makes with a second, for example adjacent, part 706*b* of the target portion 708 may be fixed at an obtuse angle. The obtuse angle may be chosen such that the first part 706*a* and the second part 706*b* together are arranged so as to approximate the curve of the curved path C. As illustrated in the example of FIG. 7, the target portion 7086 may comprise, for example, three (substantially planar as illustrated in FIG. 7) parts 706*a*, 706*b*, 706*c* with each part making an obtuse angle with respect an adjacent part. A first part 706*a* may be disposed towards the feed-in side of the curved path C, a second part 706*b* may be disposed towards a central portion of the curved path C, and a third part 706*c* may be disposed towards a feed-off side of the curved path C. The three parts 706*a*, 706*b*, 706*c* together may be arranged so as to approximate the curve of the curved path C. The deposition zone 714 may therefore approximate a curved volume in which sputter deposition of the target material 708*a*, 708*b*, 708*c* to the substrate 116 occurs in use. An increase of the surface area of the web of substrate 116 present in the deposition zone 714 at any one time may thereby be increased. This may allow for an increased area in which sputter deposition may be effected, but without substantially increasing the spatial footprint of the target portion 706, and without altering the dimensions of the curved member 118, for example.

In some examples, the target portion 706 is configurable to be arranged such that at least one part 706*a* of the target portion 706 defines a surface forming an obtuse angle with respect to a surface of another part 708*b* of the target portion 706. For example, an angle that a first part 706*a* of the target portion 706 makes with a second, for example adjacent, part 706*b* of the target portion 706 may be configurable. For example, the first part 706*a* and the second part 706*b* may be mechanically connected by a hinge element 724 or other such component that allows the angle between the first part 706 and the second part 706*b* to be changed. Similarly, the second part 706*b* and the third part 706*c* may be mechanically connected by a hinge element 726 or other such component that allows the angle between the second part 706*b* and the third part 706*c* to be changed. An actuator and suitable controller (not shown) may be provided to move the first part 706*a* and/or the third part 706*c* relative to the second part 706*b*, that is to alter the angle made between the first part 706*a* and/or the third part 706*c* relative to the second part 706*b*. This may allow for control of the plasma density experienced by the target material 708*a*, 708*c* of the first part 706*a* or third part 706*c* of the target portion, and hence may allow for control in the deposition rate in use.

Alternatively or additionally, the confining magnetic field provided by the magnetic elements 104*a*, 104*b* may be controlled by a controller (not shown) to alter the curvature of the plasma 112 and thereby control the density of plasma experienced by the target material 708*a*, 708*b*, 708*c* of the first part 706*a*, second part 706*b*, or third part 706*c* of the target portion, and hence may allow for control in the deposition rate in use.

In some examples, the target material provided on one part 706*a*, 706*b*, 706*c* of the target portion 700 may be different to the target material provided on another part 706*a*, 706*b*, 706*c* of the target portion. This may allow for a desired arrangement or composition of target material to be sputter deposited onto the web of substrate 116. Control of the plasma density experienced by one or more of the target portions 706*a*, 706*b*, 706*c*, for example by control of the angle that the first part 706*a* or third part 706*c* makes with the second part 706*b*, and/or by control of the curvature of the confined plasma via control of the magnetic elements 104*a*, 104*b*, may allow for control of the type or composition of target material that is sputter deposited onto the web of substrate 116. This may allow for flexible sputter deposition.

In the examples illustrated in FIGS. 1 to 7, the magnetic field lines characterising the confining magnetic field are each curved so as to, at least in the deposition zone 114, substantially follow the curve of the curved path C. However, this need not necessarily be the case and in other examples other arrangements may be used wherein nonetheless the confining magnetic field is characterised by magnetic field lines arranged to, at least in the deposition zone 114, substantially follow a curve of the curved path C so as to confine the plasma 112 around the curve of the curved path C.

For example, in some examples, the magnetic field lines characterising the confining magnetic field may be arranged such that an imaginary line, extending perpendicularly to each magnetic field line and connecting the magnetic field lines, is curved so as to, at least in the deposition zone, substantially follow the curve of the curved path C.

Figure 8:
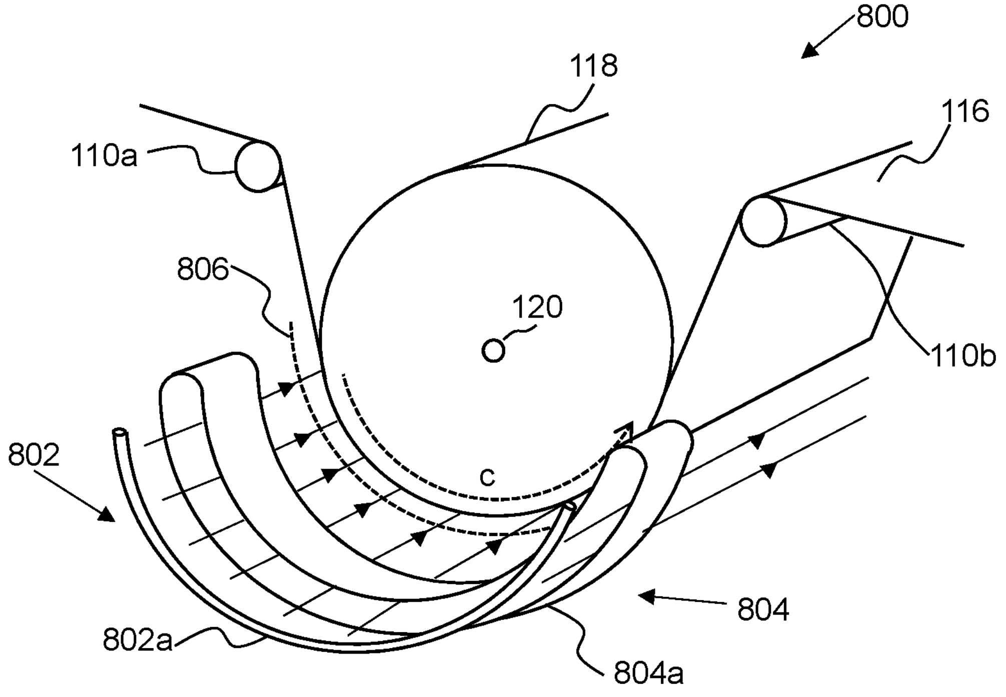
FIG. 8 is a schematic diagram that illustrates a perspective view of an apparatus according to an example.

For example, FIG. 8 illustrates an example apparatus 800. Many of the illustrated components of the apparatus 800 may be the same as those of the apparatus 100 illustrated in FIGS. 1 to 7 and described above and will not be described again. Like features are given like reference signs, and it will be appreciated that any feature of the examples described with reference to FIGS. 1 to 7 may be applied to the example illustrated in FIG. 8. However, in the example illustrated in FIG. 8, a magnetic element 804*a* of a magnetic confining arrangement 804 is arranged to provide a confining magnetic field, wherein the magnetic field lines (black arrows in FIG. 8) characterising the confining magnetic field are each themselves substantially straight but are arranged such that an imaginary line 806, extending perpendicularly to each magnetic field line and connecting the magnetic field lines, is curved so as to, at least in the deposition zone (not indicated explicitly in FIG. 8 for clarity), substantially follow the curve of the curved path C.

The plasma generation arrangement 802 may comprise one or more elongate antennae 802*a* that are curved and extend in a direction substantially perpendicular to a longitudinal axis 120 of the curved member or drum 118. In the example of FIG. 8 the longitudinal axis 120 of the curved member 118 is also the rotation axis of the curved member 118. Only one antenna 802*a* is shown in FIG. 8 for clarity but it will be appreciated that more than one such antennae 802*a* may be used. The curved antenna 802*a* may substantially follow the curve of the curved path C. For example, the curved antenna 802*a* may be parallel to but radially and axially offset from the curved path C, e.g. parallel to but radially and axially offset from the curved surface of the curved member 118 that guides the substrate along the curved path C. The curved antenna 802*a* may be driven with radio frequency power to produce plasma (not shown in FIG. 8 for clarity) having a substantially curved shape.

The magnetic element 804*a* may comprise a solenoid 804*a*. Only one magnetic element 804*a* is shown in FIG. 8 for clarity, but it will be appreciated that, for example, another such magnetic element (not shown) may be placed on the opposite side of the curved member 118 to the solenoid 804*a* in the sense of FIG. 8. The solenoid 804*a* may have an opening through which plasma (not shown in FIG. 8) is confined in use. The opening may be curved and elongate in a direction substantially perpendicular to the longitudinal axis (rotational axis) 120 of the curved member 118. The curved solenoid 804*a* may substantially follow the curve of the curved path C. For example, the curved solenoid 804*a* may be parallel to but radially and axially offset from the curved surface of the curved member 118. The curved solenoid 804*a* may be disposed intermediate of the curved antenna 802*a* and the curved member 118. The curved solenoid 804*a* provides a confining magnetic field in which the field lines are arranged such that an imaginary line 806, extending perpendicularly to each magnetic field line and connecting the magnetic field lines, is curved so as to, at least in the deposition zone, substantially follow the curve of the curved path C.

Plasma (not shown in FIG. 8) may be generated along the length of the curved antenna 802*a*, and the curved solenoid 804*a* may confine the plasma (not shown in FIG. 8) in a direction away from the curved antenna 802*a* and through the curved solenoid 804*a*. The plasma may be confined by the curved solenoid 804*a* in the form of a curved sheet. In this case, the length of the curved sheet extends in a direction parallel to the longitudinal (rotational) axis 120 of the curved member 118. The plasma, in the form of a curved sheet, may be confined by the magnetic field provided by the solenoid 804*a* around the curved member 118 and so as to replicate the curve of the curved member 118. The thickness of the curved sheet of plasma may be substantially constant along the length and width of the curved sheet. The plasma in the form of a curved sheet may have a substantially uniform density, for example the density of the plasma in the form of a curved sheet may be substantially uniform in one or both of its length and width. As described above, the plasma being confined in the form of a curved sheet may allow for an increased area in which sputter deposition may be effected and hence for more efficient sputter deposition, and/or for a more uniform distribution of plasma density at the web of substrate 116, for example in both of a direction around the curved of the curved member, and across the width of the substrate 116. This may in turn allow for a more uniform sputter deposition onto the web of substrate 116, e.g. in a direction around the surface of the curved member and across the length of the curved member 118, which may improve the consistency of the processing of the substrate.

Figure 9:
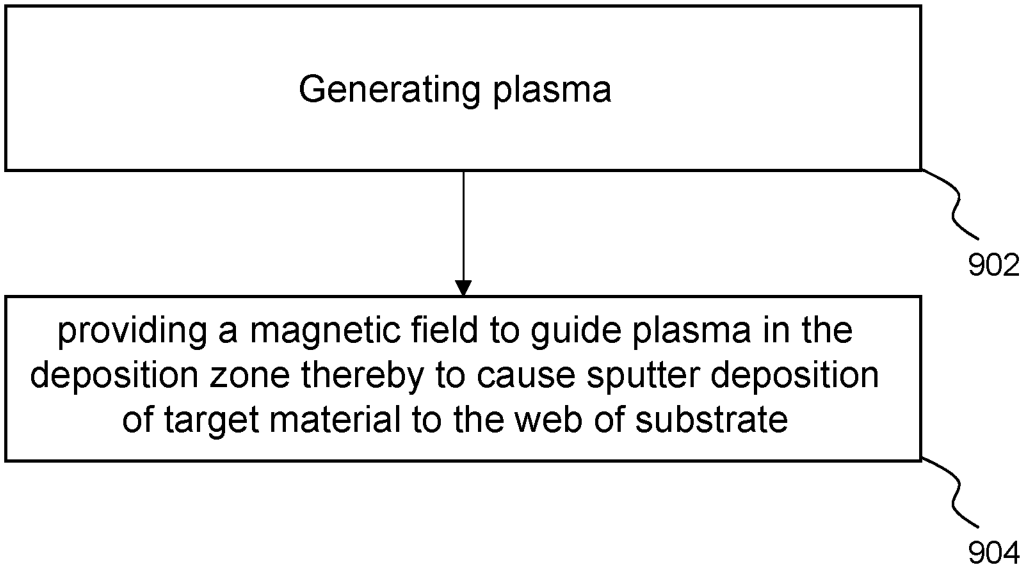
FIG. 9 is a schematic flow diagram that illustrates a method according to an example.

Referring to FIG. 9, there is illustrated schematically an example method of sputter deposition of target material 108, 608, 708*a*, 708*b*, 708*c* to a web of substrate 116. In the method, the web of substrate 116 is guided by a substrate guide 118 along a curved path C. A deposition zone 114, 614, 714 is defined between the substrate guide 118 and a target portion 106, 606, 706*a*, 706*b*, 706*c* supporting the target material 108, 608, 708*a*, 708*b*, 708*c*. The target material 108, 608, 708*a*, 708*b*, 708*c*, the web of substrate 116, the deposition zone 114, 614, 714, the target portion 106, 606, 706*a*, 706*b*, 706*c*, the substrate guide 118 and/or the curved path C may be, for example, those of any of the examples described above with reference to FIGS. 1 to 8. In some examples, the method may be performed by any one of the apparatuses 100, 600, 700, 800 described with reference to FIGS. 1 to 8.

In some examples, the method may comprise, in step 902, generating plasma. For example, the plasma may be generated by one of the plasma generation arrangements 102, 802 described above with reference to FIGS. 1 to 8.

In step 904, the method comprises providing a magnetic field to confine the plasma into the deposition zone 114, 614, 714 thereby to cause sputter deposition of target material 108, 608, 708*a*, 708*b*, 708*c* to the web of substrate 116. The magnetic field is characterised by magnetic field lines arranged to, at least in the deposition zone 114, 614, 714, substantially follow a curve of the curved path C so as to confine the plasma 112 around a curve of the curved path C For example, the plasma may be confined by one of the magnetic confining arrangements 104, 804 described above with reference to FIGS. 1 to 8.

As mentioned, confining the generated plasma 112 in this way may allow for more uniform distribution of plasma density at the web of substrate 116 at least in a direction around curve of the curved path C. This may in turn allow for a more uniform sputter deposition onto the web of substrate 116 in a direction around the surface of the curved member 118. The sputter deposition may therefore, in turn, be performed more consistently. This may, for example, improve the consistency of the processed substrate, and may for example, reduce the need for quality control. This may be as compared to, for example, magnetron type sputter deposition where the magnetic field lines characterising the magnetic field produced thereby loop tightly into and out of a substrate, and hence do not allow to provide uniform distribution of plasma density at the substrate.

Further, confining the generated plasma 112 so as to follow a curve of the curved path in this way may allow for an increased area of the substrate 116 to be exposed to the plasma 112, and hence for an increased area in which sputter deposition may be effected. This may allow, for example, for the web of substrate 116 to be fed through a reel-to-reel type apparatus at a faster rate for a given degree of deposition, and hence for more efficient sputter deposition.

The above examples are to be understood as illustrative examples of the invention. It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the invention, which is defined in the accompanying claims.

The invention claimed is:

1. An apparatus for sputter deposition of target material to a substrate, the apparatus comprising:

a substrate guide arranged to guide a substrate along a curved path, wherein the substrate is in a form of a web;

a target portion spaced from the substrate guide and arranged to support target material, the target portion and the substrate guide defining between them a deposition zone; and a confining arrangement comprising one or more magnetic elements arranged to provide a confining magnetic field to confine plasma in the deposition zone thereby to provide for sputter deposition of target material to the web of substrate in use, the confining magnetic field including magnetic field lines arranged to, at least in the deposition zone, substantially follow a curve of the curved path so as to confine said plasma around said curve of the curved path, wherein each of the one or more magnetic elements is in a form of a solenoid, the solenoid being elongate in a direction substantially perpendicular to a direction of the magnetic field lines of the confining magnetic field in use.

2. The apparatus according to claim 1, wherein the one or more magnetic elements are arranged to provide the confining magnetic field so as to confine plasma in the form of a curved sheet.

3. The apparatus according to claim 1, wherein the one or more magnetic elements are arranged to provide the confining magnetic field so as to confine plasma in the form of a curved sheet having, at least in the deposition zone, a substantially uniform density.

4. The apparatus according to claim 1, wherein one or more of the magnetic elements is an electromagnet.

5. The apparatus according to claim 4, wherein the apparatus comprises a controller arranged to control the magnetic field provided by one or more of the electromagnets.

6. The apparatus according to claim 1, wherein the confining arrangement comprises at least two of the magnetic elements arranged to provide the confining magnetic field.

7. The apparatus according to claim 6, wherein the at least two magnetic elements are arranged such that a region of relatively high magnetic field strength provided between the magnetic elements substantially follows the curve of the curved path.

8. The apparatus according to claim 1, wherein the magnetic field lines are each curved so as to, at least in the deposition zone, substantially follow the curve of the curved path.

9. The apparatus according to claim 8, wherein each solenoid has an opening via which plasma is confined in use, the opening being elongate in a direction substantially parallel to a longitudinal axis of the substrate guide.

10. The apparatus according to claim 8, the apparatus further comprising a plasma generation arrangement arranged to generate plasma, wherein the plasma generation arrangement comprises one or more elongate antennae that extend in a direction substantially parallel to a longitudinal axis of the substrate guide.

11. The apparatus according to claim 1, wherein the magnetic field lines are arranged such that an imaginary line, extending perpendicularly to each magnetic field line and connecting the magnetic field lines, is curved so as to, at least in the deposition zone, substantially follow the curve of the curved path.

12. The apparatus according to claim 11, wherein each solenoid has an opening through which plasma is confined in use, the opening being curved and elongate in a direction substantially perpendicular to a longitudinal axis of the substrate guide.

13. The apparatus according to claim 11, the apparatus further comprising a plasma generation arrangement arranged to generate plasma, wherein the plasma generation arrangement comprises one or more elongate antennae that are curved and extend in a direction substantially perpendicular to a longitudinal axis of the substrate guide.

14. The apparatus according to claim 1, wherein the target portion is arranged, or is configurable to be arranged, such that at least one part of the target portion defines a supporting surface forming an obtuse angle with respect to a supporting surface of another part of the target portion.

15. The apparatus according to claim 1, wherein the target portion is substantially curved.

16. The apparatus according to claim 1, wherein the target portion is arranged to substantially follow or approximate the curve of the curved path.

17. The apparatus according to claim 1, wherein the substrate guide is provided by a curved member that guides a web of substrate along the curved path.

18. A method of sputter deposition of target material to substrate using the apparatus of claim 1, the substrate being guided by a substrate guide along a curved path, wherein a deposition zone is defined between the substrate guide and a target portion supporting target material, the method comprising:

providing a magnetic field to confine plasma in the deposition zone thereby to cause sputter deposition of target material to the web of substrate, the magnetic field including magnetic field lines arranged to, at least in the deposition zone, substantially follow a curve of the curved path so as to confine said plasma around the curved path.

* * * * *